United States Patent
Lin et al.

(10) Patent No.: US 7,385,866 B2
(45) Date of Patent: Jun. 10, 2008

(54) LOAD-BALANCED APPARATUS OF MEMORY

(75) Inventors: Chih-Sheng Lin, Hsinchu (TW);
Chia-Pao Chang, Hsinchu (TW);
Jan-Ruei Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/347,052

(22) Filed: Feb. 3, 2006

(65) Prior Publication Data

US 2007/0109841 A1    May 17, 2007

(30) Foreign Application Priority Data

Nov. 11, 2005  (TW) ............................. 94139805 A

(51) Int. Cl.
*G11C 7/02* (2006.01)
(52) U.S. Cl. .................... 365/207; 365/208; 365/210
(58) Field of Classification Search ........... 365/207, 365/208, 210
See application file for complete search history.

(56) References Cited

U.S. PATENT DOCUMENTS

| | | | |
|---|---|---|---|
| 6,269,040 B1 * | 7/2001 | Reohr et al. ................. | 365/210 |
| 6,946,882 B2 * | 9/2005 | Gogl et al. .................... | 327/53 |
| 7,184,343 B2 * | 2/2007 | Kamata et al. ............. | 365/205 |
| 2006/0034130 A1 * | 2/2006 | Liu ........................ | 365/189.02 |

* cited by examiner

*Primary Examiner*—Connie C. Yoha
(74) *Attorney, Agent, or Firm*—Allen, Dyer, Doppelt, Milbrath & Gilchrist, P.A.

(57) ABSTRACT

A memory device is provided. The device comprises a sense amplifier having a cell input terminal and a reference input terminal, a first sub-array coupled to the cell input terminal through a first switch and coupled to the reference input terminal through a second switch, a second sub-array coupled to the cell input terminal through a third switch and coupled to the reference input terminal through a fourth switch, and a reference cell array coupled between the second switch and the fourth switch and coupled to the reference input terminal.

27 Claims, 6 Drawing Sheets

LOAD-BALANCED APPARATUS OF MEMORY

FIELD OF THE INVENTION

The present invention is a load-balanced apparatus, and more particular to a load-balanced apparatus of memory.

BACKGROUND OF THE INVENTION

In a general nonvolatile memory, for preventing the resistance of a reference magnetic tunneling junction (Reference MTJ) from being far different from that of a cell magnetic tunneling junction (Cell MTJ) due to the floating factors in the fabrication process, the Reference MTJ is usually disposed between two Cell MTJ arrays. When the memory reads data by using a sense amplifier (SA), it compares the data from the Cell MTJ to the Reference MTJ to read the data that is stored in the Cell MTJ.

Please refer to FIG. 1, which illustrates a conventional load-balanced apparatus of memory. In this apparatus, there are two switches, MrefH and MrefL, connected to a reference input terminal (Ref) of the sense amplifier 11 and connected to a high state reference line and a low state reference line for providing a reference voltage or a reference current. A Cell input terminal connects to M switches connected to M bit-lines respectively. Take M=64 for example, there are 32 folds difference of the loading between the two input terminals, Ref and Cell, of the Sense Amplifier 11. Because of the difference of the charge and discharge time between the two input terminals, Ref and Cell, of the sense amplifier 11, the reading speed will be slower and there might exist mistakes in the data reading.

Please refer to FIG. 2, which illustrates another conventional load-balanced apparatus of memory disclosed in the U.S. Pat. No. 6,711,068 of Motorola. The memory interconnect structure has a top portion of bit lines that are labeled with a "T" designator from T0 to, for example, T31, and a bottom portion of bit lines that are labeled with a "B" designator, such as from B0 to B31, that are interfaced by a multiplexer in the form of a multiplexing switch module 232. Column decoder 220 has an N-channel transistor 234 having a source connected to a bit line (BL) conductor BLT0. An N-channel transistor 235 has a source connected to a bit line conductor BLT1. An N-channel transistor 236 has a source connected to a bit line conductor BLT15.

A left portion of the column decoder 222 (BL) generally has a plurality of transistors, such as a transistor 238, a transistor 239 and a transistor 240 and other intervening transistors (not shown).

An N-channel transistor 244 has a source connected to a reference voltage terminal for receiving a first "High Reference" voltage. A gate of transistor 244 is connected to a control signal labeled "TRE" meaning "Top Reference Enable". Transistor 244 has a drain connected to conductor 241. A drain of an N-channel transistor 246 is connected to conductor 237. A gate of transistor 246 is connected to a control signal labeled "BRE" meaning "Bottom Reference Enable", and a source of transistor 246 is connected to a reference voltage terminal for receiving a second "High Reference" voltage. An N-channel transistor 264 has a source connected to a reference voltage terminal for receiving a first "Low Reference" voltage. A gate of transistor 264 is connected to a control signal labeled "TRE" meaning "Top Reference Enable". Transistor 264 has a drain connected to a conductor 263 that is a second data line of column decoder 222.

Multiplexing switch module 232 generally has balanced groups of N-channel transistors 272, 274, 276, 278, N-channel transistors 282, 284, N-channel transistors 286, 288 and N-channel transistors 292, 294, 296, 298.

In operation, each of the bit lines BLT0-BLT15, BLT16-BLT31, BLB0-BLB15 and BLB16-BLB31 is connected to a predetermined memory sub-array column (not shown). Assume for exemplary purposes only that transistor 235 is made conductive. In response, data from the accessed column is placed onto the sensing rail, conductor 237. In addition, the control signal TRE to the high reference in the top left sub-array and to the low reference in the top right sub-array is made active. In response, the data from the high reference bit line and the low reference bit line is placed onto the sensing rails of conductor 241 and conductor 263, respectively. Since only one sub-array is active, either the top or the bottom sub-array, none of the other switches formed by transistors 238, 239 through 240 that share the same conductor 241 is conductive. Also, none of the switches formed by transistors 260, 261 through 262 that share the same conductor 263 is conductive. Given that the number of switches connected to conductors 237, 241, 251 and 263 is equal, there is balanced capacitance on the interconnect structure. In particular, the capacitive loading on the accessed bit line connected to conductor 237 resulting from the off-state switches (transistors 234, 236, etc.) on conductor 237 is completely balanced with the capacitive loading on the high reference bit line connected to conductor 241 and the low reference bit line connected to conductor 63. Thus the capacitive loading for any enabled reference bit line is provided by the nonconductive transistor switches of the inactive sub-array connected to the common sensing rail that the enabled reference bit line is on.

The three inputs of sense amplifier 224 and conductors 270, 280 and 290 have an equal number, four, of switch junctions on them and thus maintain capacitive balance with respect to each other. The loading from transistors 272, 274, 276 and 278 is balanced by the loading from transistors 282, 284, 286 and 288 and is also balanced by the loading from transistors 292, 294, 296 and 298. Since there is complete balance within the structure of the four sensing rails of column decode 220 and column decode 222, and complete balance within the structure of the multiplexing switch module 232, data from any bit line and its corresponding pair of references (high and low) can all three be transported to the sense amplifier 224 in a fully balanced manner.

Based on the above, it is shown that the mentioned patent separates the memory device into four memory sub-arrays and connects each sub-array to a high or low reference cell switch by using switches. The mentioned patent reads the memory by using a sense amplifier with three input terminals, thereby making the loads of the three input terminals of the sense amplifier equal to the loads of the memory sub-arrays plus the load of a reference cell switch, so as to balance the load of each input terminal of the sense amplifier. However, the apparatus in the mentioned patent has to separate the memory into four memory sub-arrays and the operation thereof is more complicated.

Please refer to FIG. 3, which illustrates a further conventional load-balanced apparatus of memory disclosed in the U.S. Pat. No. 6,269,040 of IBM. This apparatus comprises two sub-arrays 342, 344 of memory cell columns, two switch units 341, 343 associated with the two sub-arrays 342, 344, respectively, two sense amplifiers 346, 348 for sensing data from the two sub-arrays 342, 344 via the two switch units 341, 343, respectively, and two connection units 345, 347 for providing electrical connections between input lines of the two sense amplifiers 346, 348. Each sub-array includes multiple memory cell columns and two reference cell columns which are preferably positioned in the middle of the multiple memory cell columns. For example, the first sub-array 342 has multiple memory cell columns $CL_A$, $CL_B$, $CL_C$, $CL_D$ and two reference cell columns $CL_0$, $CL_1$, which are preferably placed in the middle of the memory cell columns $CL_A$, $CL_B$, $CL_C$, $CL_D$. Each memory cell column has multiple memory cells each having data "1" or "0" (i.e., higher or lower resistance). Reference cell column $CL_i$ has multiple reference cells each having value "1" (i.e., higher resistance), and reference cell column $CL_0$ has multiple reference cells each having value "0" (i.e., lower resistance).

The second sub-array 344 and the second switch unit 343 have the same configuration as the first sub-array 342 and the first switch unit 341, except for connections between reference switches in the second switch unit 343 and input lines of the second sense amplifier 348.

Under control of the decoding signal R1, the first connection unit 345 can be electrically connected so that a conduction path is formed via the first connection unit 345 between a selected reference cell of the reference cell column $CL_1$ via the reference switch $SW_1$ and a selected reference cell of the reference cell column $CL'_0$ via the reference switch $SW'_0$. Thereby, values "1" and "0" are summed to provide the reference (i.e., averaged value "½") to complement inputs of the first and second sense amplifiers 346, 348. In a like manner, the second connection unit 347 in response to the decoding signal $R_2$ may sum the values "0" and "1" provided from selected reference cells of the reference cell column $CL_0$ and the reference cell column $CL'_1$, respectively. Once such a conduction path is formed and the currents having logic values "0" and "1" are summed, the first and second sense amplifiers 346, 348 divide or share the summed current so that each sense amplifier receives averaged (i.e., mid-level "½") current.

Based on the above, it is shown that the mentioned patent separates the memory into two sub-cell arrays, a left sub-cell array and a right one, and increases the number of the reference cells to two. The mentioned patent reads the memory by using two sense amplifiers, thereby making the load of each sense amplifier equal by using the middle switch, so as to balance the load of each input terminal of the sense amplifier. This apparatus needs two sense amplifiers in practice, and the middle switch makes the loads of the input terminals of the sense amplifier unbalanced.

From the above description, it is known that how to develop a load-balanced apparatus of memory has become a major problem waited to be solved. In order to overcome the drawbacks in the prior arts, an improved load-balanced apparatus of memory is provided. The particular design in the present invention not only solves the problems described above, but also is easy to be implemented. Thus, the invention has the utility for the industry.

SUMMARY OF THE INVENTION

The major aspect of the present invention is to provide a memory with a simple structure.

According to the foregoing aspect, the present invention provides a memory device comprising a sense amplifier having a cell input terminal and a reference input terminal; a first sub-array coupled to the cell input terminal through a first switch and coupled to the reference input terminal through a second switch; a second sub-array coupled to the cell input terminal through a third switch and coupled to the reference input terminal through a fourth switch; and a reference cell array coupled between the second switch and the fourth switch and coupled to the reference input terminal.

Preferably, the first sub-array comprises N switches and a plurality of memory cells.

Preferably, the first switch is coupled to the second switch.

Preferably, the first switch and the second switch are transistors.

Preferably, the second sub-array comprises N switches and a plurality of memory cell.

Preferably, the third switch is coupled to the fourth switch.

Preferably, the third switch and the fourth switch are transistors.

Preferably, the reference cell array comprises two switches and a plurality of reference cell.

Preferably, the plurality of reference cell comprises a plurality of high state reference cell and a plurality of low state reference cell.

Preferably, when the first sub-array is read, the switches of the second sub-array are electrically connected to the reference input terminal through the fourth switch.

Preferably, when the second sub-array is read, the switches of the first sub-array are electrically connected to the reference input terminal through the second switch.

Preferably, the memory device further comprises two virtual switches coupled to the cell input terminal.

According to the foregoing aspect, the present invention provides a memory device comprising a sense amplifier having a cell input terminal and a reference input terminal; a first sub-array coupled to the cell input terminal through a first switch and coupled to the reference input terminal through a second switch; a second sub-array coupled to the cell input terminal through a third switch and coupled to the reference input terminal through a fourth switch; a third sub-array coupled to the cell input terminal through a fifth switch and coupled to the reference input terminal through a sixth switch; a fourth sub-array coupled to the cell input terminal through a seventh switch and coupled to the reference input terminal through a eighth switch; a first reference cell array coupled to the first switch, the third switch, and the cell input terminal through a first control switch and coupled to the second switch, the fourth switch, and the reference input terminal through a second control switch; and a second reference cell array coupled to the fifth switch, the seventh switch, and the cell input terminal through a third control switch and coupled to the sixth switch, the eighth switch, and the reference input terminal through a fourth control switch.

Preferably, the first sub-array comprises N switches and a plurality of memory cells.

Preferably, the first switch is electrically connected to the second switch.

Preferably, the second sub-array comprises N switches and a plurality of memory cells.

Preferably, the third switch is electrically connected to the fourth switch.

Preferably, the first reference cell array comprises two switches and a plurality of reference cells.

Preferably, the third sub-array comprises N switches and a plurality of memory cells.

Preferably, the fifth switch is electrically connected to the sixth switch.

Preferably, the fourth sub-array comprises N switches and a plurality of memory cells.

Preferably, the seventh switch is electrically connected to the eighth switch.

Preferably, the second reference cell array comprises two switches and a plurality of reference cells.

Preferably, when the first sub-array is read, the switches of the second sub-array are electrically connected to the reference input terminal through the fourth switch and the two switches of the second reference cell array are electrically connected to the cell input terminal through the third control switch.

Preferably, when the second sub-array is read, the switches of the first sub-array are electrically connected to the reference input terminal through the second switch and the two switches of the second reference cell array are connected to the cell input terminal through the third control switch.

Preferably, when the third sub-array is read, the switches of the fourth sub-array are electrically connected to the reference input terminal through the eighth switch and the two switches of the first reference cell array are connected to the cell input terminal through the first control switch.

Preferably, when the fourth sub-array is read, the switches of the third sub-array are electrically connected to the reference input terminal through the sixth switch and the two switches of the first reference cell array are electrically connected to the cell input terminal through the first control switch.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
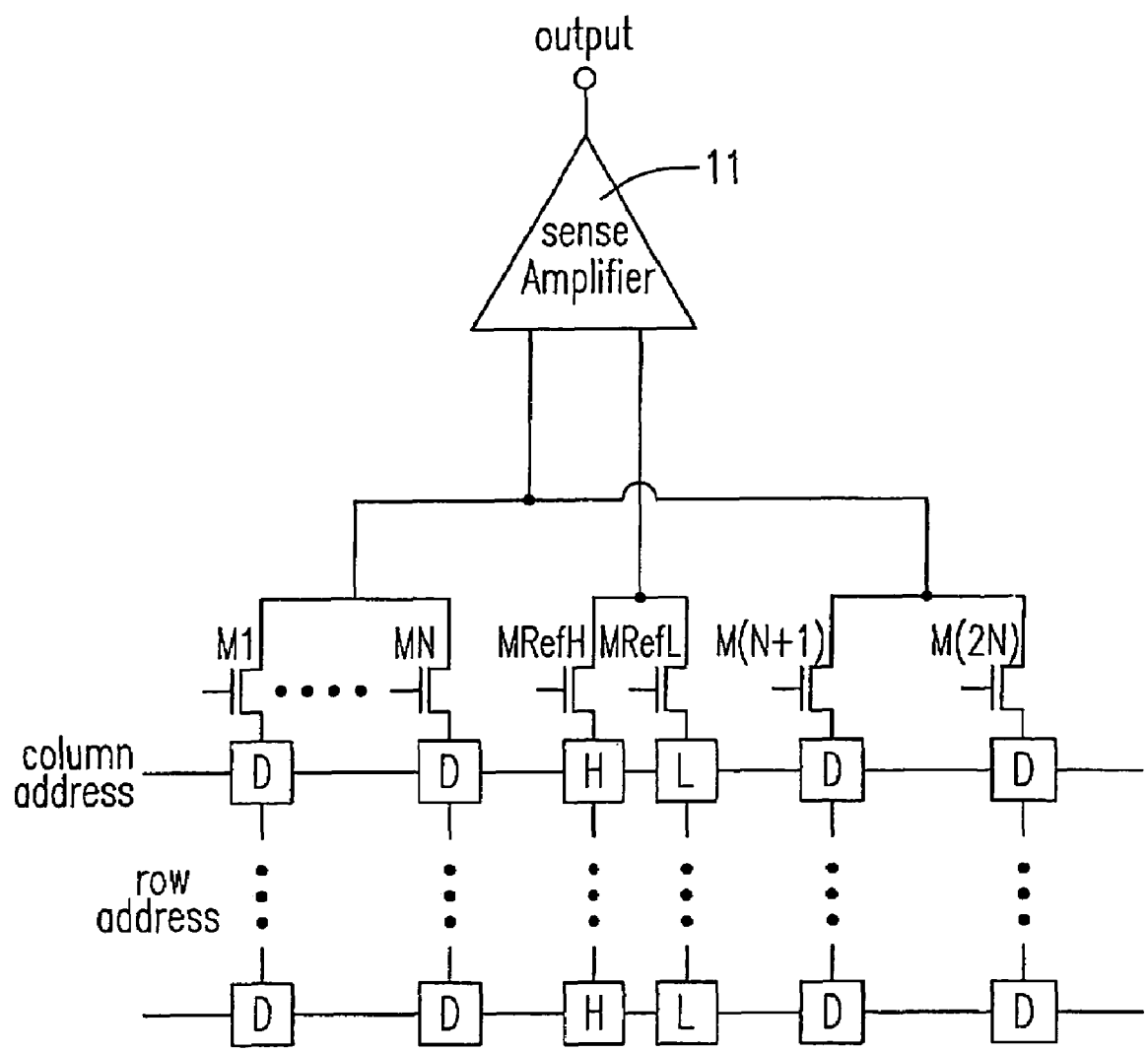
FIG. 1 illustrates a conventional balance-load apparatus of memory.
Figure 2:
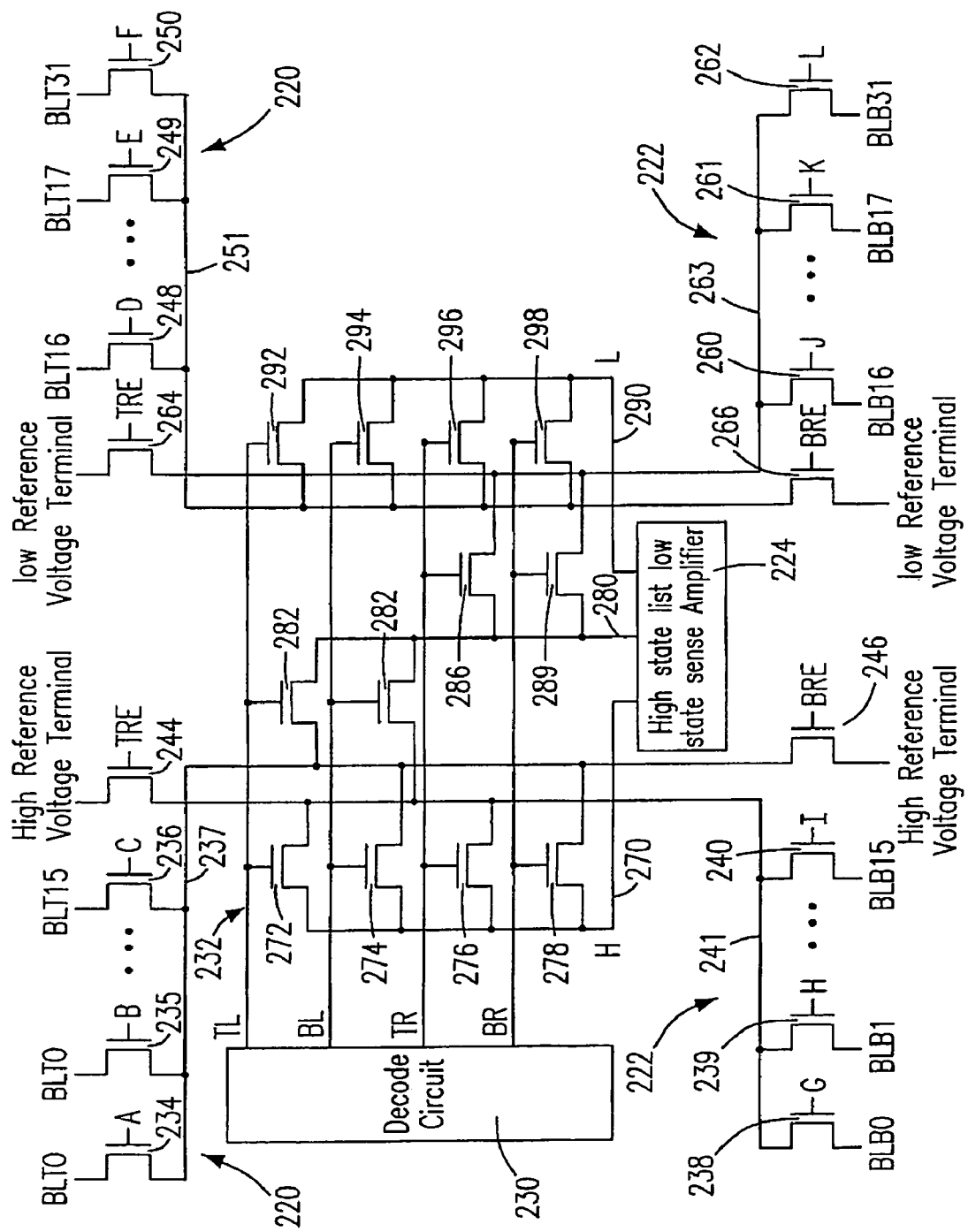
FIG. 2 illustrates another conventional balance-load apparatus of memory.
Figure 3:
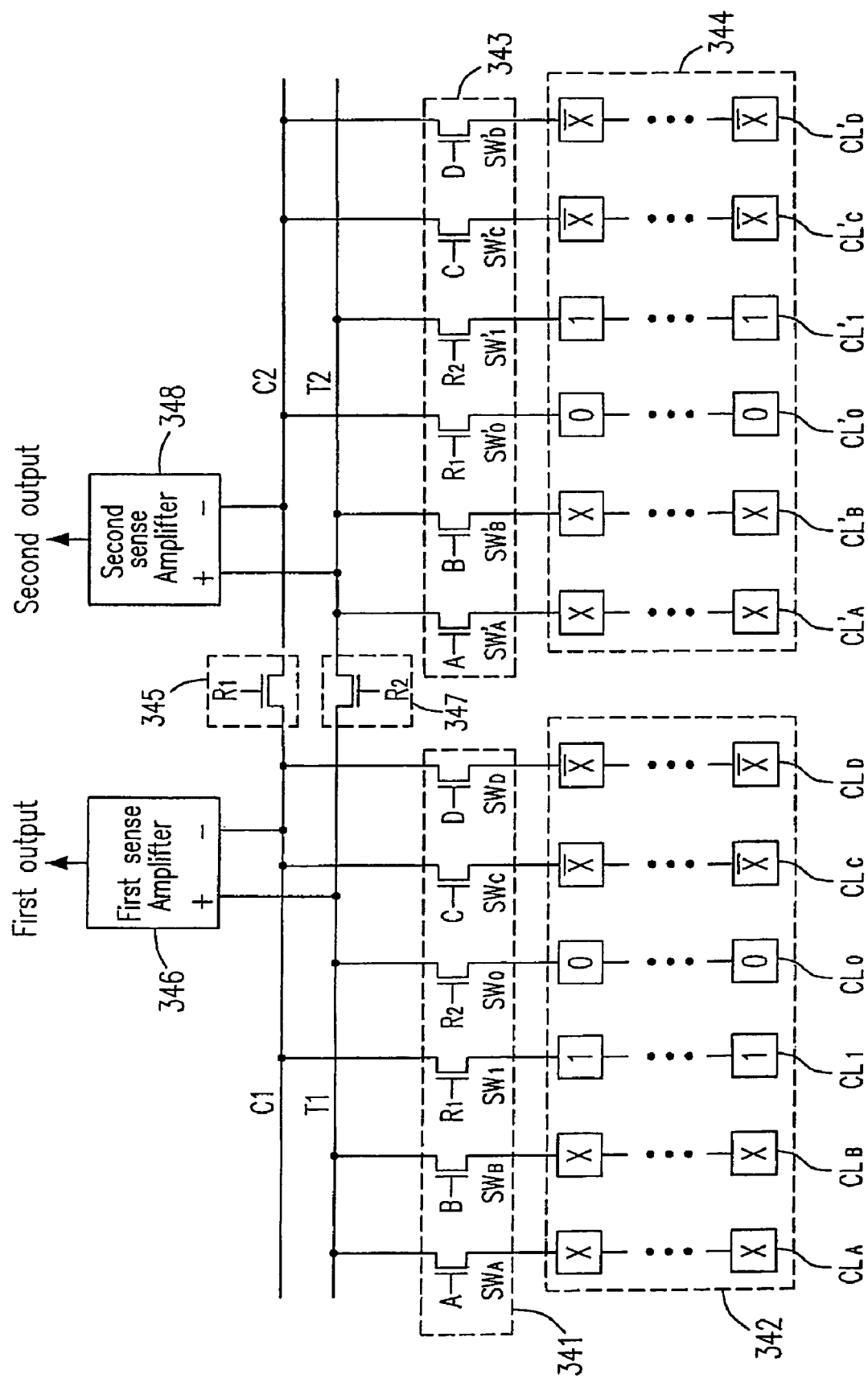
FIG. 3 illustrates a further conventional balance-load apparatus of memory.
Figure 4:
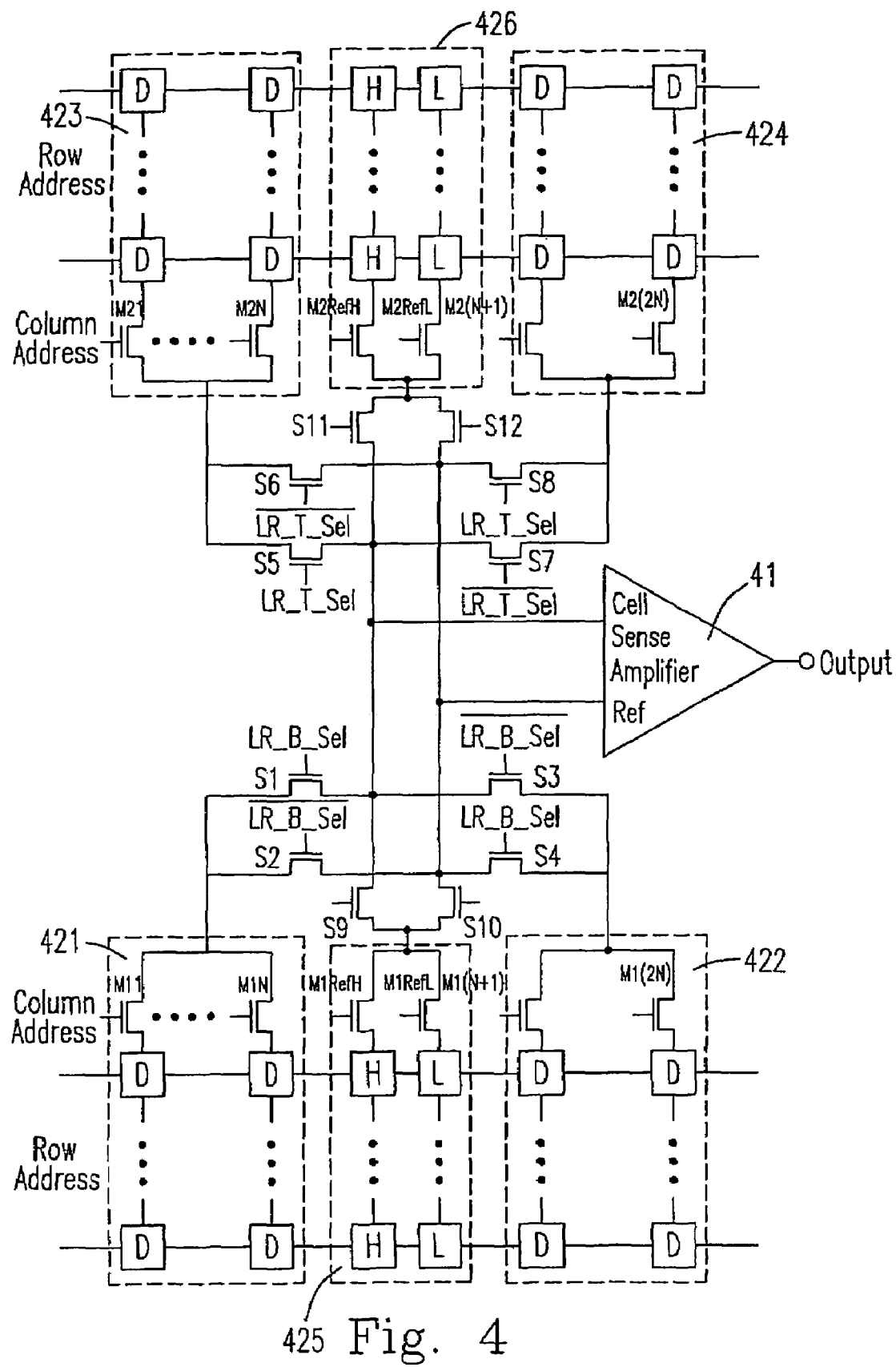
FIG. 4 illustrates a balance-load apparatus of memory according to a first preferred embodiment of the present invention.

Please refer to FIG. 4, which illustrates a balance-load apparatus of memory according to a first preferred embodiment of the present invention. The apparatus separates the memory array into a first sub-array 421 in the bottom left side, a second sub-array 422 in the bottom right side, a third sub-array 423 in the top left side, and a fourth sub-array 424 in the top right side. The number of memory cells in each sub-array is equal, and the apparatus further comprises a first reference cell array 425 in the bottom side and a second reference cell array 426 in the top side. Besides, the apparatus further comprises a sense amplifier 41 having a cell input terminal (Cell) and a reference input terminal (Ref). The number of memory cells in each sub-array in FIG. 4 is preferably equal, but it also can be different according to actual needs.

The first sub-array 421 comprises N switches M11~M1N and a plurality of memory cells (D). The second sub-array 422 comprises N switches M1(N+1)~M1(2N) and a plurality of memory cells (D). The third sub-array 423 comprises N switches M21~M2N and a plurality of memory cells (D). The fourth sub-array 424 comprises N switches M2(N+1)~M2(2N) and a plurality of memory cells (D). The first reference cell array 425 comprises 2 switches, M1RefH and M1RefL, and plural reference cells, H and L. The second reference cell array 426 comprises 2 switches, M2RefH and M2RefL, and plural reference cells, H and L.

The first sub-array 421 is coupled to the cell input terminal (Cell) through a first switch S1, and coupled to the reference input terminal (Ref) through a second switch S2. The second sub-array 422 is coupled to the cell input terminal (Cell) through a third switch S3, and coupled to the reference input terminal (Ref) through a fourth switch S4. The third sub-array 423 is coupled to the cell input terminal (Cell) through a fifth switch S5, and coupled to the reference input terminal (Ref) through a sixth switch S6. The fourth sub-array 424 is coupled to the cell input terminal (Cell) through a seventh switch S7, and coupled to the reference input terminal (Ref) through a eighth switch S8. The first reference cell array 425 is coupled to the first switch S1, the third switch S3, and the cell input terminal through a first control switch S9 and coupled to the second switch S2, the fourth switch S4, and the reference input terminal Ref through a second control switch. The second reference cell array 426 is coupled to the fifth switch S5, the seventh switch S7, and the cell input terminal through a third control switch S11 and coupled to the sixth switch S6, the eighth switch S8, and the reference input terminal Ref through a fourth control switch S12. By using the apparatus described above, when the sense amplifier 41 is in operation, the load of the cell input terminal (Cell) is equal to that of the reference input terminal (Ref), and the load will be reduced to half.

The first reference cell array 425 is substantially located between the first sub-array 421 and the second sub-array 422, and the second reference cell array 426 is substantially located between the third sub-array 423 and the fourth sub-array 424. When the address being read is in the first sub-array 421, the switches, M1(N+1) and M1(2N), of the second sub-array 422 are coupled to the reference input terminal Ref through the fourth switch S4, and the two switches, M2RefH and M2RefL, of the second reference cell array 426 are coupled to the cell input terminal (Cell) through the third control switch S11.

When the address being read is in the second sub-array 422, the switches, M11 and M1N, of the first sub-array 421 are coupled to the reference input terminal (Ref) through the second switch S2, and the two switches, M2RefH and M2RefL, of the second reference cell array 426 are coupled to the cell input terminal (Cell) through the third control switch S11.

When the address being read is in the third sub-array 423, the switches, M2(N+1) and M2(2N), of the fourth sub-array 424 are coupled to the reference input terminal (Ref) through the eighth switch S8, and the two switches, M1RefH and M1RefL, of the first reference cell array 425 are coupled to the cell input terminal (Cell) through the first control switch S9.

When the address being read is in the fourth sub-array 424, the switches, M21 and M2N, of the third sub-array 423 are coupled to the reference input terminal (Ref) through the sixth switch S6, and the two switches, M1RefH and M1RefL, of the first reference cell array 425 are coupled to the cell input terminal (Cell) through the first control switch S9.

Through the circuit operation mode described above, every time the apparatus reads, the loads of the reference input terminal (Ref) and the cell input terminal (Cell) of the sense amplifier 41 are both regarded as N+2 switches, and the load of the cell input terminal (Cell) is reduced to half.

Figure 5:
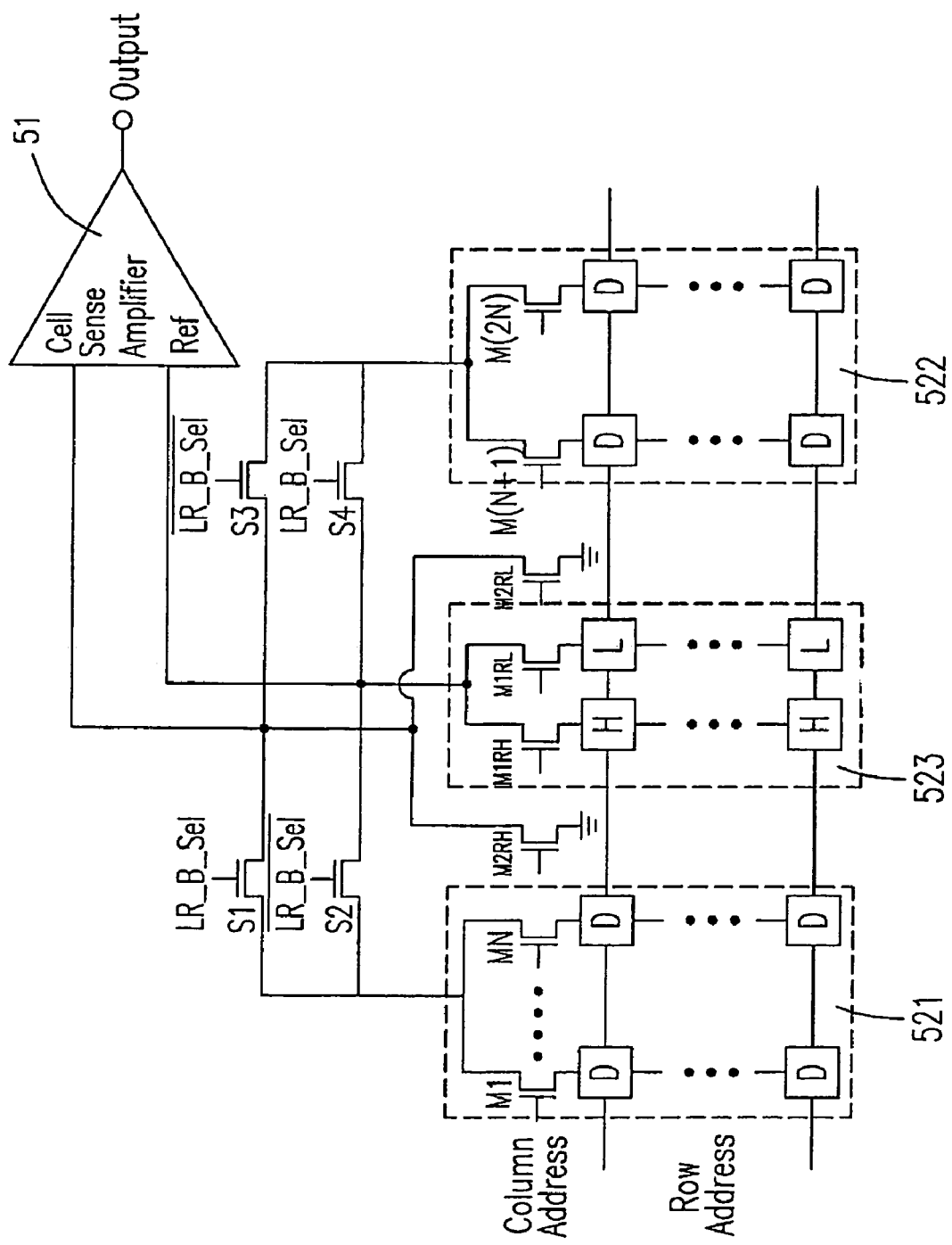
FIG. 5 illustrates a balance-load apparatus of memory according to a second preferred embodiment of the present invention.

Please refer to FIG. 5, which illustrates a balance-load apparatus of memory according to a second preferred embodiment of the present invention. The apparatus separates the memory array into a first sub-array 521 in the left side and a second sub-array 522 in the right side, and the number of memory cells in each sub-array is equal. A reference cell array 523 is disposed between the first sub-array 521 and the second sub-array 522. Besides, the apparatus further comprises a sense amplifier 51 having a cell input terminal (Cell) and a reference input terminal (Ref). The number of memory cells in each sub-array described above is preferably equal, but it also can be different according to actual needs.

The first sub-array 521 comprises N switches M1~MN and a plurality of memory cells (D). The second sub-array 522 comprises N switches M(N+1)~M(2N) and a plurality of memory cells (D). The reference cell array 523 comprises two switches, M1RH and M1RL, and plural reference cells, H and L, and the cell input terminal (Cell) of the sense amplifier 51 connects to two virtual switches, M2RH and M2RL, whose loads are identical to those of the switches, M1RH and M1RL, of the reference input terminal.

The first sub-array 521 is coupled to the cell input terminal (Cell) through a first switch S1, and coupled to the reference input terminal (Ref) through a second switch S2. The second sub-array 522 is coupled to the cell input terminal (Cell) through a third switch S3, and coupled to the reference input terminal (Ref) through a fourth switch S4. The reference cell array 523 is coupled to the reference input terminal (Ref) and disposed between the second switch S2 and the fourth switch S4.

The reference cell array 523 is substantially located between the first sub-array 521 and the second sub-array 522. When the address being read is in the first sub-array 521, the switches, M(N+1) and M(2N), of the second sub-array 522 are coupled to the reference input terminal (Ref) through the fourth switch S4. When the address being read is in the second sub-array 522, the switches, M1 and MN, of the first sub-array 521 are coupled to the reference input terminal (Ref) through the second switch S2.

Through the circuit operation mode described above, every time the apparatus reads, the loads of the reference input terminal (Ref) and the cell input terminal (Cell) of the sense amplifier 51 are equal (both regarded as N switches).

Figure 6:
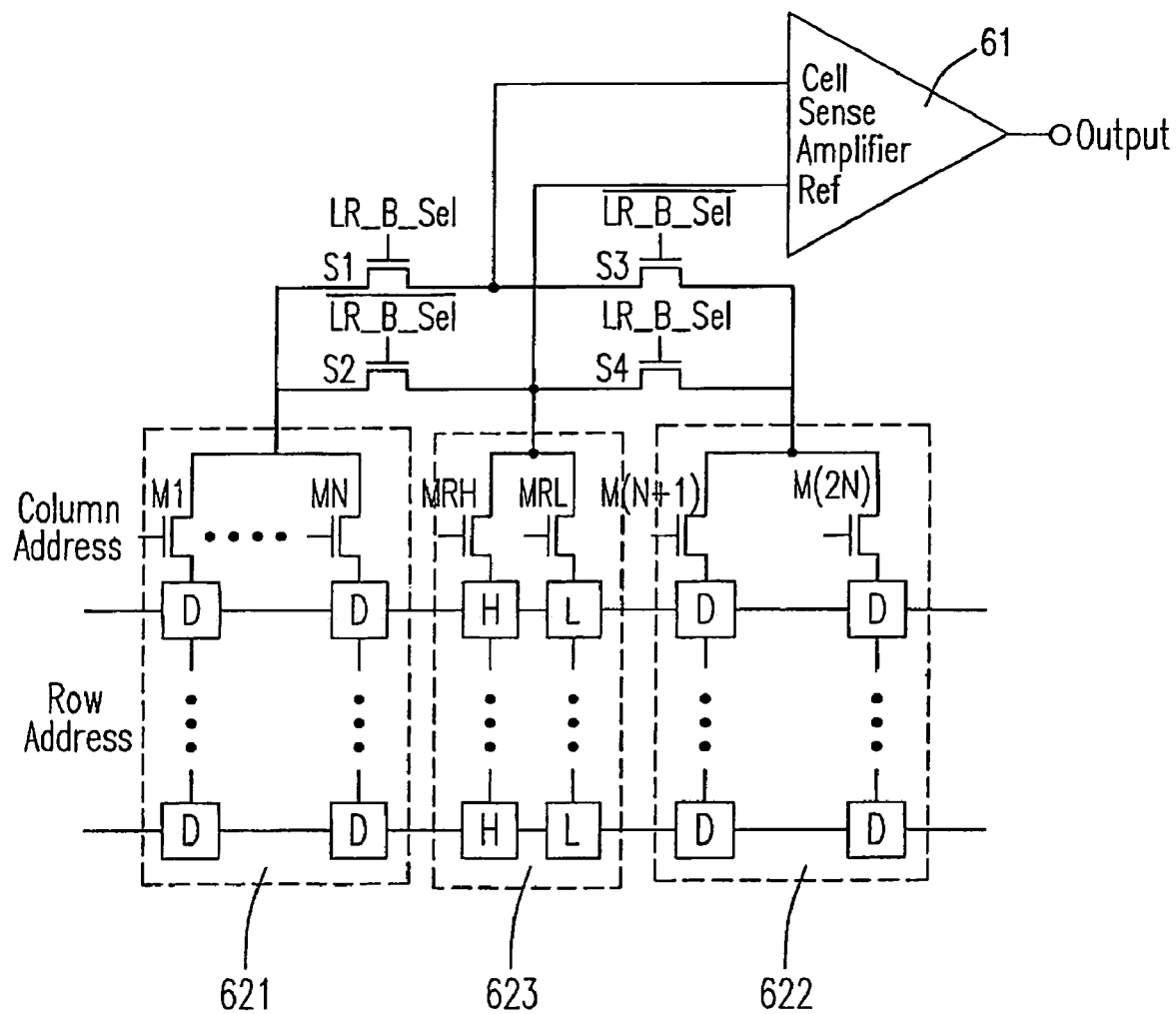
FIG. 6 illustrates a balance-load apparatus of memory according to a third preferred embodiment of the present invention.

Please refer to FIG. 6, which illustrates a balance-load apparatus of memory according to a third preferred embodiment of the present invention. The apparatus separates the memory array into a first sub-array 621 in the left side and a second sub-array 622 in the right side, and the number of memory cells in each sub-array is equal. A reference cell array 623 is disposed between the first sub-array 621 and the second sub-array 622. Besides, the apparatus further comprises a sense amplifier 61 having a cell input terminal (Cell) and a reference input terminal (Ref). The number of memory cells in each sub-array described above is preferably equal, but it also can be different according to actual needs.

The first sub-array 621 comprises N switches M1~MN and a plurality of memory cells (D). The second sub-array 622 comprises N switches M(N+1)~M(2N) and a plurality of memory cells (D). The reference cell array 623 comprises 2 switches, MRH and MRL, and plural reference cells, H and L.

The first sub-array 621 is coupled to the cell input terminal (Cell) through a first switch S1, and coupled to the reference input terminal (Ref) through a second switch S2. The second sub-array 622 is coupled to the cell input terminal (Cell) through a third switch S3, and coupled to the reference input terminal (Ref) through a fourth switch S4. The reference cell array 623 is coupled to the reference input terminal (Ref) and disposed between the second switch S2 and the fourth switch S4.

The reference cell array 623 is substantially located between the first sub-array 621 and the second sub-array 622. When the address being read is in the first sub-array 621, the switches, M(N+1) and M(2N), of the second sub-array 622 are coupled to the reference input terminal (Ref) through the fourth switch S4. When the address being read is in the second sub-array 622, the switches, M1 and MN, of the first sub-array 621 are coupled to the reference input terminal (Ref) through the second switch S2.

The load-balanced apparatus of memory in FIG. 6 does not use the virtual switches that are only connected to the cell input terminal, and other operations are the same as the apparatus in FIG. 5. By using the apparatus in FIG. 6, the difference between the load of the cell input terminal (Cell) and the reference input terminal (Ref) in the sense amplifier 61 is only regarded as the load of the reference switches, MRH and MRL, of the reference cell array 623. Generally, the load of the reference switch is much smaller than those of the first sub-array 621 and the second sub-array 622, so the load-balanced effect could still be achieved. Besides, the apparatus further comprises the advantage of easier operation.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present application which is defined by the appended claims.

What is claimed is:

1. A memory device, comprising:
    a sense amplifier having a cell input terminal and a reference input terminal;
    a first sub-array coupled to said cell input terminal through a first switch and coupled to said reference input terminal through a second switch;
    a second sub-array coupled to said cell input terminal through a third switch and coupled to said reference input terminal through a fourth switch; and
    a reference cell array coupled to said second switch and said fourth switch and both coupled to said reference input terminal, and coupled to said first switch and said third switch and both coupled to said cell input terminal.

2. A memory device according to claim 1, wherein said first sub-array comprises N switches and a plurality of memory cells.

3. A memory device according to claim 1, wherein said first switch is coupled to said second switch.

4. A memory device according to claim 1, wherein said first switch and said second switch are transistors.

5. A memory device according to claim 1, wherein said second sub-array comprises N switches and a plurality of memory cells.

6. A memory device according to claim 1, wherein said third switch is coupled to said fourth switch.

7. A memory device according to claim 1, wherein said third switch and said fourth switch are transistors.

8. A memory device according to claim 1, wherein said reference cell array comprises two switches and a plurality of reference cells.

9. A memory device according to claim 8, wherein said plurality of reference cells comprise a plurality of high state reference cells and a plurality of low state reference cells.

10. A memory device according to claim 1, wherein, when said first sub-array is read, said switches of said second sub-array are electrically connected to said reference input terminal through said fourth switch.

11. A memory device according to claim 1, wherein, when said second sub-array is read, said switches of said first sub-array are electrically connected to said reference input terminal through said second switch.

12. A memory device according to claim 1, further comprising two virtual switches coupled to said cell input terminal.

13. A memory device, comprising:
a sense amplifier having a cell input terminal and a reference input terminal;
a first sub-array coupled to said cell input terminal through a first switch and coupled to said reference input terminal through a second switch;
a second sub-array coupled to said cell input terminal through a third switch and coupled to said reference input terminal through a fourth switch;
a third sub-array coupled to said cell input terminal through a fifth switch and coupled to said reference input terminal through a sixth switch;
a fourth sub-array coupled to said cell input terminal through a seventh switch and coupled to said reference input terminal through a eighth switch;
a first reference cell array coupled to said first switch, said third switch, and said cell input terminal through a first control switch and coupled to said second switch, said fourth switch, and said reference input terminal through a second control switch; and
a second reference cell array coupled to said fifth switch, said seventh switch, and said cell input terminal through a third control switch and coupled to said sixth switch, said eight switch, and said reference input terminal through a fourth control switch.

14. A memory device according to claim 13, wherein said first sub-array comprises N switches and a plurality of memory cells.

15. A memory device according to claim 13, wherein said first switch is electrically connected to said second switch.

16. A memory device according to claim 13, wherein said second sub-array comprises N switches and a plurality of memory cells.

17. A memory device according to claim 13, wherein said third switch is electrically connected to said fourth switch.

18. A memory device according to claim 13, wherein said first reference cell array comprises two switches and a plurality of reference cells.

19. A memory device according to claim 13, wherein said third sub-array comprises N switches and a plurality of memory cells.

20. A memory device according to claim 13, wherein said fifth switch is electrically connected to said sixth switch.

21. A memory device according to claim 13, wherein said fourth sub-array comprises N switches and a plurality of memory cells.

22. A memory according to claim 13, wherein said seventh switch is electrically connected to said eighth switch.

23. A memory device according to claim 13, wherein said second reference cell array comprises two switches and a plurality of reference cells.

24. A memory device according to claim 13, wherein, when said first sub-array is read, said switches of said second sub-array are electrically connected to said reference input terminal through said fourth switch and said two switches of said second reference cell array are electrically connected to said cell input terminal through said third control switch.

25. A memory device according to claim 13, wherein, when said second sub-array is read, said switches of said first sub-array are electrically connected to said reference input terminal through said second switch and said two switches of said second reference cell array are connected to said cell input terminal through said third control switch.

26. A memory device according to claim 13, wherein, when said third sub-array is read, said switches of said fourth sub-array are electrically connected to said reference input terminal through said eighth switch and said two switches of said first reference cell array are connected to said cell input terminal through said first control switch.

27. A memory device according to claim 13, wherein, when said fourth sub-array is read, said switches of said third sub-array are electrically connected to said reference input terminal through said sixth switch and said two switches of said first reference cell array are electrically connected to said cell input terminal through said first control switch.

* * * * *